United States Patent [19]
Iyer et al.

[11] Patent Number: 5,463,254
[45] Date of Patent: Oct. 31, 1995

[54] FORMATION OF 3-DIMENSIONAL SILICON SILICIDE STRUCTURES

[75] Inventors: Subramanian S. Iyer, Yorktown Heights; Richard D. Thompson, Lake Peekskill; King-Ning Tu, Chappaqua, all of N.Y.

[73] Assignee: International Business Machines Corporation, Armonk, N.Y.

[21] Appl. No.: 279,669

[22] Filed: Jul. 25, 1994

Related U.S. Application Data

[63] Continuation of Ser. No. 968,648, Oct. 30, 1992, abandoned.

[51] Int. Cl.$^6$ .......................... H01L 21/283; H01L 23/48
[52] U.S. Cl. .................. 257/757; 257/520; 257/621; 257/190; 257/768; 257/755
[58] Field of Search ...................... 257/751, 754, 257/755, 757, 520, 190, 189, 621, 756, 508, 278, 768

[56] References Cited

U.S. PATENT DOCUMENTS

| | | | |
|---|---|---|---|
| 3,855,009 | 12/1974 | Lloyd et al. | 148/1.5 |
| 4,378,628 | 4/1983 | Levinstein et al. | 257/754 |
| 4,554,045 | 11/1985 | Bean et al. | 156/613 |
| 4,561,916 | 12/1985 | Akiyama et al. | 257/190 |
| 4,816,421 | 3/1989 | Dynes et al. | 437/26 |
| 4,818,723 | 4/1989 | Yen | 437/200 |
| 4,885,615 | 12/1989 | Warner, Jr. et al. | 257/508 |
| 4,916,083 | 4/1990 | Monkowski et al. | 257/754 |
| 4,966,868 | 10/1990 | Murali et al. | 437/193 |
| 5,061,985 | 10/1991 | Meguro et al. | 257/751 |
| 5,073,815 | 12/1991 | Kosaka et al. | 257/768 |
| 5,192,714 | 3/1993 | Suguro et al. | 437/195 |

FOREIGN PATENT DOCUMENTS

| | | |
|---|---|---|
| 60-21558 | 2/1985 | Japan. |
| 1-243513 | 9/1989 | Japan. |

OTHER PUBLICATIONS

Ishizaka et al., "Formation of Embedded Monocrystalline NiSi2 Grid Layers in Silicon by MBE", JPN, J. Appl. Phys. Part 2 (Japan), v. 23, n. 7, pp. 499–501, 1984.

Von Kanel et al., "Epitaxy of Metal Silicides", Thin Solid Films, v. 184 (1990) pp. 295–308.

*Primary Examiner*—Robert P. Limanek
*Assistant Examiner*—Alexander Oscar Williams
*Attorney, Agent, or Firm*—Robert M. Trepp

[57] ABSTRACT

An epitaxial conductor and a method for forming buried conductor patterns is described incorporating a layer of single crystalline silicon, a pattern formed therein such as a trench, a layer of metal silicide epitaxial formed on the bottom surface of the pattern or trench, a layer of silicon epitaxially formed thereover, and a layer of metal silicide epitaxially formed over the silicon layer. The invention overcomes the problem of twinning defects in the top surface of epitaxial silicide layers.

27 Claims, 3 Drawing Sheets

FORMATION OF 3-DIMENSIONAL SILICON SILICIDE STRUCTURES

This is continuation of application Ser. No. 07/968,648, filed Oct. 30, 1992, now abandoned.

BACKGROUND OF THE INVENTION

1. Field of the Invention

This invention relates to semiconductor structures, and more particularly, to forming a pattern of lines of epitaxial silicide embedded in a silicon layer or substrate.

2. Background Art

To construct a 3-dimensional structure within a silicon wafer, the essential step is to be able to build a conducting line within or below the surface of the silicon wafer. The line is required to have epitaxial relationship to the surrounding silicon, meaning on its four sides if the line has a rectangular cross-section. Using current techniques, it is easy to in-lay a non-epitaxial line in silicon, but it prevents us from building on the surface of the non-epitaxial line a 3-dimensional structure without destroying the single crystal nature of the silicon, which is crucial from the point of view of device application. Since it is difficult or nearly impossible to grow epitaxial layers above lines, metallic cobalt silicide and nickel silicide thin films have been studied as a component of an epitaxial superlattice structure on silicon, such as $Si/CoSi_2/Si/CoSi_2$. However, the superlattice is not truly a 3-dimensional structure because the silicide is formed as a layer and not as a line or pattern of lines.

In a publication by A. Ishizaka et al. entitled "Formation of Embedded Monocrystalline $NiSi_2$ Grid Layers in Silicon by M.B.E.", Jpn. J. Appl. Phys. Part. 2, Vol. 23, No. 7, pp. 499–501, July 1984, overgrowth of monocrystalline silicon films had been formed by the molecular beam epitaxy technique on patterned $NiSi_2$ layer which were epitaxially grown on Si (111) substrates. The embedded $NiSi_2$ grid layer can form a buried electrode in a transistor and in other novel devices.

In Japanese patent document JP6021558, published Feb. 2, 1985, entitled "Bi-Polar Type Semiconductor Integrated Circuit Device", a layer of cobalt is deposited over silicon, followed by a heat treatment to form cobalt silicide. The remaining cobalt was subsequently etched. Then an N type epitaxial layer was selectively formed over the cobalt silicide layer. Subsequently, a base layer and an intermediate layer are formed resulting in a bipolar transistor having a low resistant buried layer made of a silicide metallic film.

In U.S. Pat. No. 4,816,421 which issued on Mar. 28, 1989 to R. C. Dynes et al., a buried heteroepitaxial structure termed "mesotaxy" is formed by implantation of at least one chemical species such as Co, Ni, Cr, Y or Mg into a single crystal body such as Si or Ge such that a buried layer rich in the implanted species is formed and heat treated such that a buried stoichiometric compound layer such as $CoSi_2$ is formed which is epitaxial with the Si matrix, has high conductivity and is of good crystalline quality.

In U.S. Pat. No. 4,554,045 which issued on Nov. 19, 1985 to J. C. Bean et al., a silicon substrate is shown in FIG. 3 covered with a silicide layer, a single crystal silicon layer and another silicide layer, each with appropriate electrical contacts to form, for example, Schottky diodes, back-to-back diodes, a pnpn structure or a silicon controlled rectifier. The silicide layers are composed of nickel silicide or cobalt silicide.

SUMMARY OF THE INVENTION

In accordance with the present invention, an apparatus and method for providing a buried epitaxial conductor in a semiconductor wafer is described comprising a substrate which may be silicon or alloys thereof, a first layer of crystalline semiconductor which may be, for example, silicon or alloys thereof, a trench formed in the first layer, such as by reactive ion etching having sidewall surfaces and a bottom surface, a second layer of epitaxial metal silicide formed on the bottom surface of the trench, the epitaxial metal silicide may be, for example, cobalt silicide, nickel silicide or alloys thereof, a third layer of semiconductor which may be silicon or alloys thereof epitaxially formed on the second layer in the trench, and a fourth layer of metal silicide epitaxially formed on the third layer in the trench.

The invention may further have the thickness of the second and fourth layer adjusted, one thick and one thin, whereby twinning defects are propagated upward to the sidewalls of the trench.

The invention may further be used to form buried epitaxial heterostructure layers such as silicon, silicon germanium alloys and silicon carbon alloys with lattice mismatching with twinning defects propagating upwards and towards the edge of the layer.

It is an object of the invention to provide a superlattice which is a truly a 3-dimensional structure.

It is a further object of the invention to provide a silicide line or a pattern of silicide lines inside a silicon layer or substrate or in a semiconductor layer or substrate other than silicon.

It is a further object of the invention to build a conducting line within a semiconductor layer or substrate having an epitaxial relationship to the surrounding semiconductor such as silicon, for example, on its four sides if the line is buried and has a rectangular cross-section.

It is further desirable to provide a trench in a semiconductor substrate having a material formed at the bottom of the trench having an upper surface which is epitaxial with the sidewalls of the trench.

It is further desirable to provide a multilayer structure wherein twinning is accounted for with respect to the crystalline orientation of the surrounding sidewalls of a single crystalline semiconductor.

BRIEF DESCRIPTION OF THE DRAWING

These and other features, objects, and advantages of the present invention will become apparent upon a consideration of the following detailed description of the invention when read in conjunction with the drawing, in which.

DESCRIPTION OF THE PREFERRED EMBODIMENT

Figure 1:
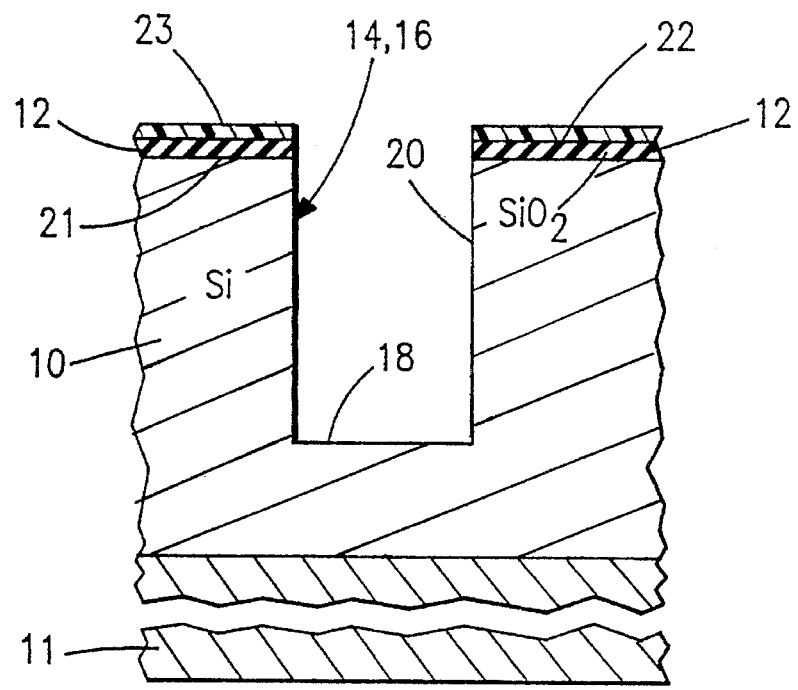
FIG. 1 is a cross-section view of a trench in a silicon layer.

Referring now to the drawing, FIG. 1 shows a silicon layer 10, on a substrate 11, a layer 12 of dielectric such as silicon dioxide is formed on layer 10 and an opening or trench 14 is formed in layers 12 and 10. Trench 14 has sidewalls 16 and 20 and a bottom surface 18. Layer 10 may be, for example, single crystal silicon or alloys thereof such as, for example, a silicon germanium alloy, a silicon carbon alloy, or a silicon germanium carbon alloy. Substrate 11 may be single crystal semiconductor such as silicon or alloys thereof. Trench 14 may be formed by wet etching or by reactive ion etching. The upper surface 21 of silicon layer 10 may be in the (100) or (111) plane. Layer 12 provides a mask for forming trench 14 through an opening in layer 12.

Trench 14 may be formed by using photolithographic techniques to produce the outline of the trench or a pattern of lines in photoresist 23 on surface 22 of silicon dioxide layer 12. Reactive ion etching may then be used to etch silicon dioxide layer 12 and to etch into silicon layer 10 to form a trench or pattern of trenches following the desired line pattern. Following the step of etching by reactive ion etching, photoresist 23 is removed. Trench 14 of layer 10 may be cleaned of residue native oxide and other chemicals by wet etching and rinsing or substrate 11 may be transferred to a molecular beam epitaxy (MBE) chamber and processed to achieve atomic level cleaning of residue native oxide and other chemicals on sidewalls 16 and 20 and bottom surface 18 of trench 14 shown in FIG. 1 which may include a pattern of trenches not shown in FIG. 1.

Figure 2:
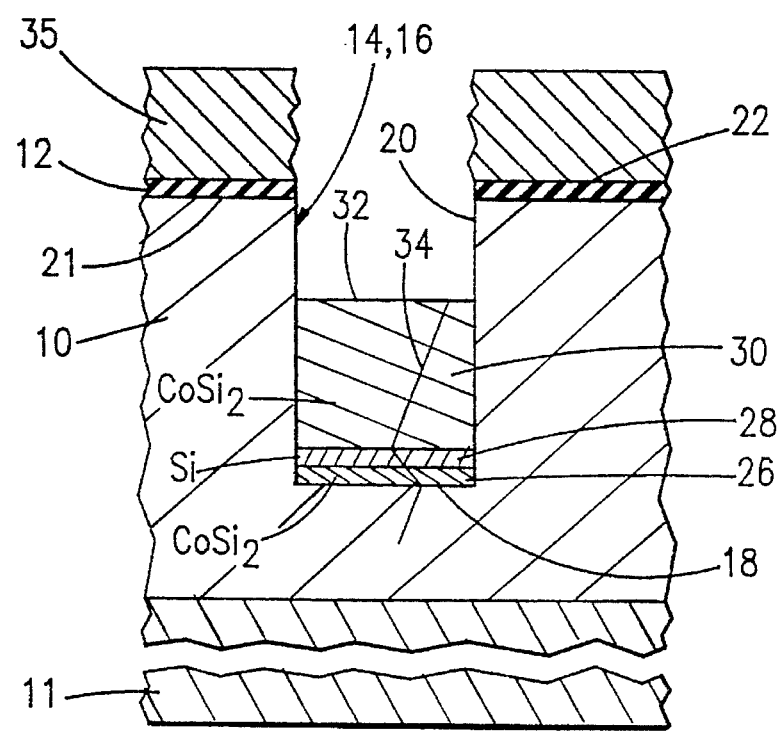
FIG. 2 is a cross-section view of one embodiment of the invention.

Referring to FIG. 2, trench 14 is shown having a layer 26 formed on bottom surface 18 of trench 14. In FIG. 2, like references are used for functions corresponding to the apparatus of FIG. 1. Layer 26 may have a thickness in the range from 10 to 22 Å and is epitaxially formed on lower surface 18 such as by molecular beam epitaxy or may be, for example, cobalt silicide, nickel silicide or alloys thereof. A layer 28 of semiconductor such as silicon or alloys thereof is epitaxially formed over layer 26. Layer 28 may be, for example, silicon and have a thickness in the range from 10 to 22 Å. Layer 30 is epitaxially formed over layer 28 and may be, for example, a cobalt silicide, nickel silicide or alloys thereof. Layer 30 may have a thickness in the range from 1000 to 2000 Å. Layer 30 has an upper surface 32 which has the same crystalline orientation as bottom surface 18 of trench 14. Layers 26, 28 and 30 may be formed by molecular beam epitaxy and are not only epitaxial with respect to bottom surface 18 of layer 10 but are also epitaxial with respect to sidewalls 16 and 20 of trench 14. Selected materials for layers 26, 28 and 30 may be cobalt silicide, silicon, and cobalt silicide, respectively. The deposition on upper surface 22 during the formation of layers 26, 28 and 30 forms a layer 35 which may be subsequently removed by etching or chemical-mechanical (chem-mech) polishing.

Tri-layers 26, 28 and 30 functions to assure that the top cobalt silicide surface 32 enables the epitaxial growth of silicon thereover which has the same crystallographic orientation as the surrounding silicon of silicon layer 10. The same crystallographic orientation is due to the fact that cobalt silicide tends to grow in twinning orientation with respect to the (111) bottom surface 18 of trench 14 or with respect to the (100) bottom surface 18 of trench 14 when layer 10 is silicon. The twinning orientation in silicon layer 10 and layers 26, 28 and 30 are shown by zig-zag line 34.

Figure 3:
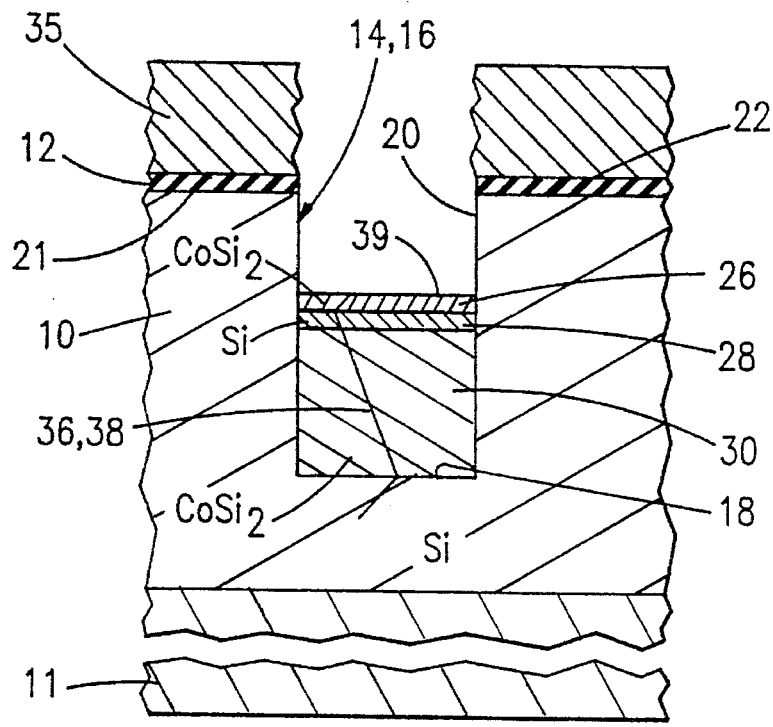
FIG. 3 is a cross-section view of an alternate embodiment of the invention.

Referring to FIG. 3, layers 26, 28 and 30 are reversed in order of formation in trench 14 and are epitaxial with respect to one another and bottom surface 18. The twinning orientation is indicated by zig-zag line 36 in FIG. 3. In FIG. 3, like references are used for functions corresponding to the apparatus of FIG. 2. As shown by zig-zag line 36, line portion 38 passing through layer 30 is in twinning relation with the surrounding silicon layer 10, i.e. sidewalls 16 and 20. Upper surface 39 of layer 26 has the same crystallographic orientation as the surrounding silicon in layer 10.

Figure 4:
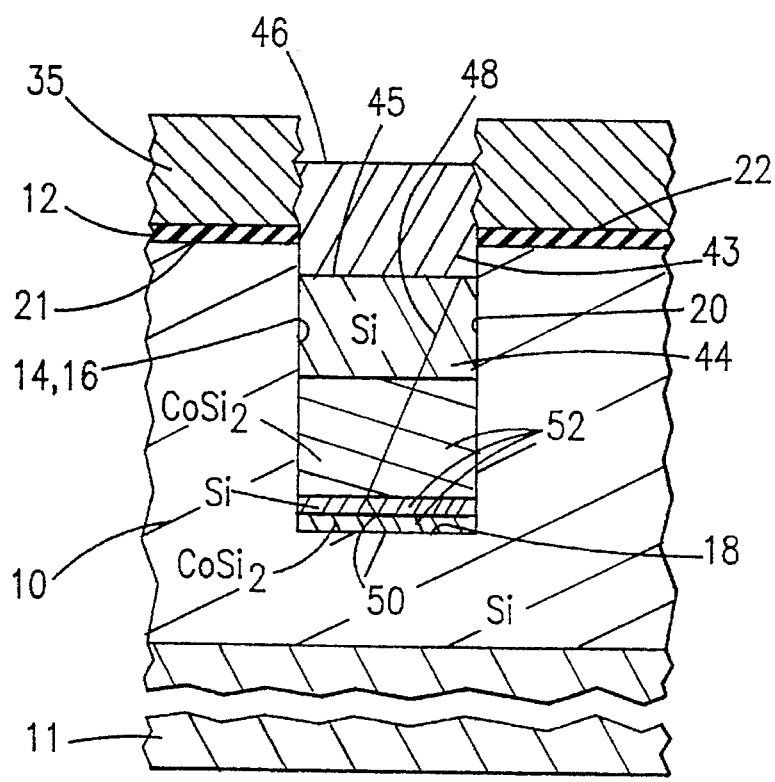
FIG. 4 is a cross-section view of FIG. 2 with an additional epitaxial silicon layer formed in the trench.

Referring to FIG. 4, the embodiment of FIG. 2 is further shown with epitaxial layer 44 of silicon or alloys thereof formed over upper surface 32 of layer 30. In FIG. 4, like references are used for functions corresponding to the apparatus of FIG. 2. Layer 44 may be, for example, one micrometer thick and if the trench is deep, layer 44 may have an upper surface 45 below the top of the trench. Alternately, layer 44 may include layer 43 and have a thickness which exceeds the top of trench 14, surface 21 as shown in FIG. 4, by upper surface 46. Zig-zag line 48 indicates the twinning orientation with respect to layer 10. Straight line portion 50 shows that layer 26 and layer 28 are in twinning relation with the surrounding silicon layer 10.

Figure 5:
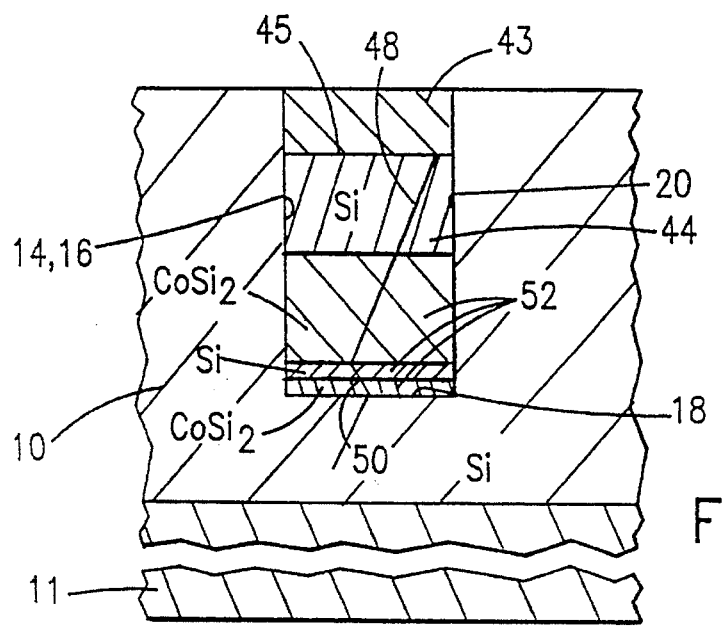
FIG. 5 is a cross-section view of FIG. 4 after chemical-mechanical polishing.
Figure 6:
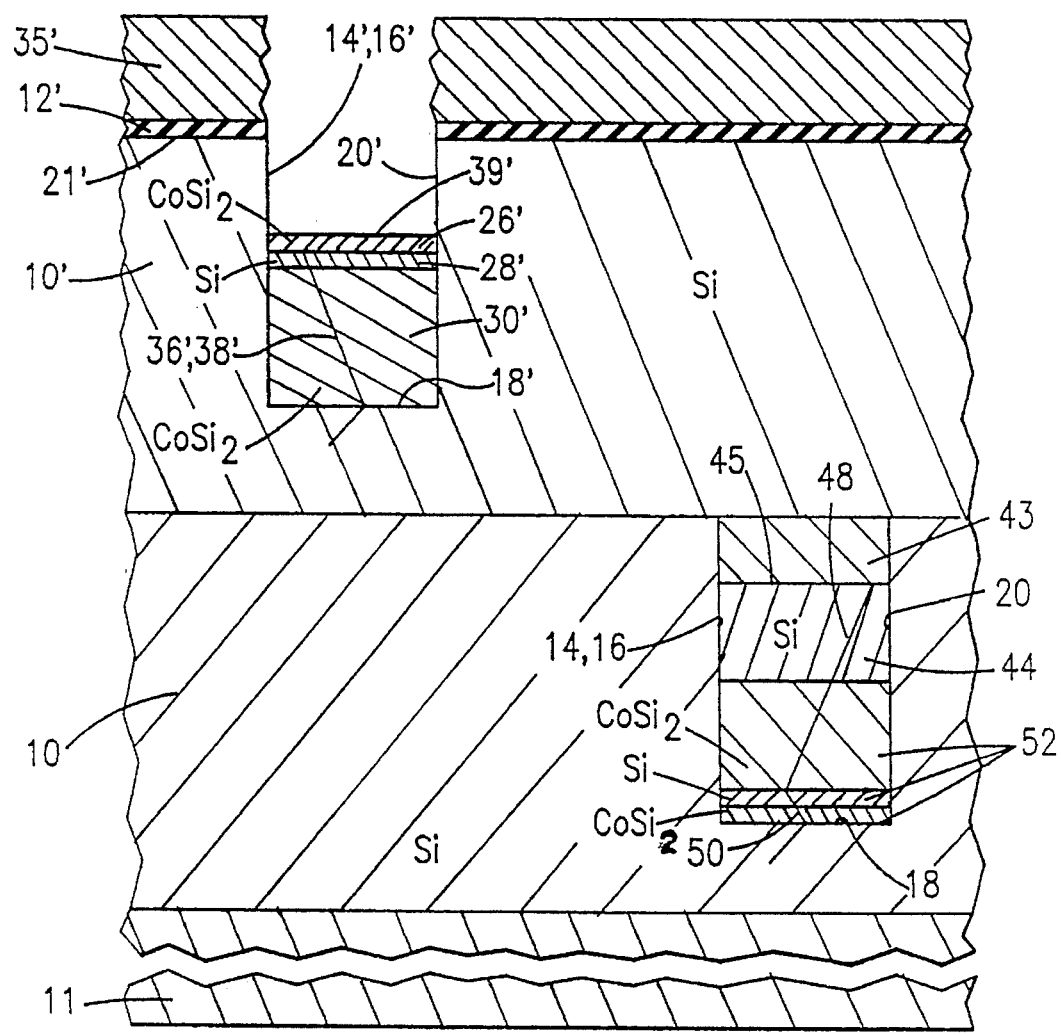
FIG. 6 is a cross-section view of a second embodiment of the invention

The deposition on top of silicon dioxide layer 12 as shown by layer 35 may be removed followed by the removal of layer 12. The upper surface 21 of layer 10 as well as the upper surface 46 of layer 43 or the upper surface 45 of layer 44 may be polished to obtain a planar surface as shown in FIG. 5. In FIG. 5, like references are used for functions corresponding to the apparatus of FIG. 4. The process shown in FIGS. 1, 2 and 4 or 1, 3 and 4 may be repeated to build another set of conductor lines embedded in layer 10 formed of a metal silicide having a new pattern. Or a new layer 10' of silicon may be deposited first as shown in FIG. 6, prior to forming another embedded line or pattern of lines in new layer 10'. In FIG. 6, like references are used for functions corresponding to the apparatus of FIGS. 3 and 5.

In FIG. 4, layer 44 has the same crystallographic orientation as layer 10 and is epitaxial with respect to sidewalls 16 and 20 of trench 14. Layers 26 and 30 may be cobalt silicide, nickel silicide or alloys thereof.

The formation of buried epitaxial cobalt silicide or nickel silicide layers in (111) or (100) silicon has been described which may be used as a buried conductor 52 in a 3-dimensional structure with epitaxial layer 44 formed thereover. A tri-layer conductor 52 of epitaxial metal silicide, silicon, and metal silicide is formed having respective layer thicknesses to direct twinning defects to the edges of trench 14. The buried tri-layer conductor 52 may be formed in a trench 14 in silicon layer 10 with an epitaxial silicon layer 44 grown thereover and in epitaxial relationship to the silicon sidewalls 16 and 20 and bottom surface 18 of trench 14.

While there has been described and illustrated an epitaxial conductor in a trench in a single crystalline single layer, it will be apparent to those skilled in the art that modifications and variations are possible without deviating from the broad scope of the invention which shall be limited solely by the scope of the claims added hereto.

Having thus described our invention, what we claim as new and desire to secure by Letters Patent is:

1. An epitaxial conductor comprising:

a substrate of single crystalline semiconductor material selected from the group consisting of silicon and alloys thereof, a first trench formed in said substrate having sidewall surfaces and a bottom surface, a first layer of single crystalline metal silicide epitaxially formed on said bottom surface, a second layer of single crystalline semiconductor material selected from the group consisting of silicon and alloys thereof epitaxially formed on said first layer, and a third layer of single crystalline metal silicide epitaxially formed on said second layer, said first and second layers being in twinning relationship to said substrate, said third layer being in twinning relationship to said first and second layers, and said third layer having the same crystallographic orientation as said substrate.

2. The epitaxial conductor of claim 1 wherein said metal silicide is selected from the group consisting of cobalt silicide and nickel silicide.

3. The epitaxial conductor of claim 1 further including a fourth layer of single crystalline semiconductor material selected from the group consisting of silicon and alloys thereof epitaxially formed on said third layer.

4. The epitaxial conductor of claim 3 wherein said fourth layer of semiconductor material has a thickness to substantially fill said trench.

5. The epitaxial conductor of claim 3 wherein said fourth layer of semiconductor material has the same crystallographic orientation as said substrate of crystalline semiconductor material.

6. The epitaxial conductor of claim 1 wherein said first layer of metal silicide has a thickness in the range front 10 to 22 Å.

7. The epitaxial conductor of claim 1 wherein said second layer of semiconductor material has a thickness in the range from 10 to 22 Å.

8. The epitaxial conductor of claim 1 wherein said substrate has a (111) silicon surface.

9. The epitaxial conductor of claim 1 wherein said substrate has a silicon surface selected from the group consisting of (100) and (001).

10. The epitaxial conductor or claim 6 wherein said third layer of metal silicide has a thickness in the range from 1000 to 2000 Å.

11. The epitaxial conductor of claim 1 wherein said first layer of metal silicide has a thickness in the range from 1000 to 2000 Å.

12. The epitaxial conductor of claim 11 wherein said third layer of metal silicide has a thickness in the range from 10 to 22 Å.

13. The epitaxial conductor of claim 1 wherein said substrate further includes a plurality of trenches having said first, second, and third layers to form a pattern of conductors in said plurality of trenches in said substrate.

14. The epitaxial conductor of claim 3 wherein the upper surface of said fourth layer of semiconductor material is coplanar with said upper surface of said substrate.

15. The epitaxial conductor of claim 3 further including a fifth layer of semiconductor material selected from the group consisting of silicon and alloys thereof formed on the upper surface of said substrate and fourth layers.

16. The epitaxial conductor of claim 15 wherein the upper surface of said fourth layer of semiconductor material is coplanar with said upper surface of said substrate.

17. The epitaxial conductor of claim 15 further including:

a second trench formed in said fifth layer having sidewall surfaces and a bottom surface, a sixth layer of metal silicide epitaxially formed on said bottom surface, a seventh layer of semiconductor material selected from the group consisting of silicon and alloys thereof epitaxially formed on said sixth layer, and an eighth layer of metal silicide epitaxially formed on said seventh layer.

18. The epitaxial conductor of claim 17 further including a first pattern of first trenches in said substrate having said first, second, and third layers therein and a second pattern of second trenches in said fifth layer having said sixth, seventh, and eighth layers therein.

19. The epitaxial conductor of claim 1 wherein said first trench is formed in said first layer and said substrate.

20. An epitaxial conductor comprising:

a substrate, a first layer of single crystalline semiconductor material selected from the group consisting of silicon and alloys thereof epitaxially formed on said substrate, said first layer having a (111) silicon surface, a first trench formed in said first layer having sidewall surfaces and a bottom surface, a second layer of metal silicide epitaxially formed on said bottom surface, a third layer of semiconductor material selected from the group consisting of silicon and alloys thereof epitaxially formed on said second layer, and a fourth layer of metal silicide epitaxially formed on said third layer.

21. An epitaxial conductor comprising:

a substrate, a first layer of single crystalline semiconductor material selected from the group consisting of silicon and alloys thereof epitaxially formed on said substrate, said first layer has a silicon surface selected from the group consisting of (100) and (001), a first trench formed in said first layer having sidewall surfaces and a bottom surface, a second layer of metal silicide epitaxially formed on said bottom surface, a third layer of semiconductor material selected from the group consisting of silicon and alloys thereof epitaxially formed on said second layer, and a fourth layer of metal silicide epitaxially formed on said third layer.

22. An epitaxial conductor comprising:

a substrate, a first layer of single crystalline semiconductor material selected from the group consisting of silicon and alloys thereof epitaxially formed on said substrate, a first trench formed in said first layer having sidewall surfaces and a bottom surface, a second layer of metal silicide epitaxially formed on said bottom surface, said second layer of metal silicide having a thickness in the range from 10 to 22 Å, a third layer of semiconductor material selected from the group consisting of silicon and alloys thereof epitaxially formed on said second layer, and a fourth layer of metal silicide epitaxially formed on said third layer, said fourth layer of metal silicide having a thickness in the range from 1000 to 2000 Å.

23. An epitaxial conductor comprising:

a substrate, a first layer of single crystalline semiconductor material selected from the group consisting of silicon and alloys thereof epitaxially formed on said substrate, a first trench formed in said first layer having sidewall surfaces and a bottom surface, a second layer of metal silicide epitaxially formed on said bottom surface, said second layer of metal silicide having a thickness in the range from 1000 to 2000 Å, a third layer of semiconductor material selected from the group consisting of silicon and alloys thereof epitaxially formed on said second layer, and a fourth layer of metal silicide epitaxially formed on said third layer, said fourth layer of metal silicide having a thickness in the range from 10 to 22 Å.

24. An epitaxial conductor comprising:

a substrate, a first layer of single crystalline semiconductor material selected from the group consisting of silicon and alloys thereof epitaxially formed on said substrate, a first trench formed in said first layer having sidewall surfaces and a bottom surface, a second layer of metal silicide epitaxially formed on said bottom surface, a third layer of semiconductor material selected from the group consisting of silicon and alloys thereof epitaxially formed on said second layer, a fourth layer of metal silicide epitaxially formed on said third layer, a fifth layer of semiconductor material selected from the group consisting of silicon and alloys thereof epitaxially formed on said fourth layer, and a sixth layer of semiconductor material selected from the group consisting of silicon and alloys thereof formed on the upper surface of said first and fifth layers.

25. The epitaxial conductor of claim 24 wherein the upper surface of said fifth layer of semiconductor material is coplanar with said upper surface of said first layer.

26. The epitaxial conductor of claim 24 further including:

a second trench formed in said sixth layer having sidewall surfaces and a bottom surface, a seventh layer of metal silicide epitaxially formed on said bottom surface, an eight layer of semiconductor material selected from the group consisting of silicon and alloys thereof epitaxially formed on said seventh layer, and a ninth layer of metal silicide epitaxially formed on said eighth layer.

27. The epitaxial conductor of claim 26 further including a first pattern of first trenches in said first layer having said second, third and fourth layers therein and a second pattern of second trenches in said sixth layer having said seventh, eight, and ninth layers therein.

* * * * *